(12) United States Patent
Jo et al.

(10) Patent No.: US 10,483,968 B2
(45) Date of Patent: Nov. 19, 2019

(54) APPARATUS AND METHOD FOR DETERMINING OPTIMUM STACK NUMBER OF RF SWITCH

(71) Applicant: Samsung Electro-Mechanics Co., Ltd., Suwon-si (KR)

(72) Inventors: Byeong Hak Jo, Suwon-si (KR); Jeong Hoon Kim, Suwon-si (KR); Hyun Paek, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 16/242,518

(22) Filed: Jan. 8, 2019

(65) Prior Publication Data

US 2019/0267992 A1 Aug. 29, 2019

(30) Foreign Application Priority Data

Feb. 28, 2018 (KR) .................... 10-2018-0024631
Jul. 13, 2018 (KR) .................... 10-2018-0081875

(51) Int. Cl.
*H03K 17/693* (2006.01)
*H03K 17/687* (2006.01)
*H03K 17/0812* (2006.01)

(52) U.S. Cl.
CPC ..... *H03K 17/693* (2013.01); *H03K 17/08122* (2013.01); *H03K 17/6871* (2013.01)

(58) Field of Classification Search
CPC ........... H03K 17/693; H03K 17/08122; H03K 17/6871
See application file for complete search history.

(56) References Cited

U.S. PATENT DOCUMENTS

| 6,781,805 | B1 * | 8/2004 | Urakawa | H01L 27/0251 |
| | | | | 361/111 |
| 7,404,157 | B2 * | 7/2008 | Tanabe | G01R 31/2621 |
| | | | | 257/347 |
| 8,405,147 | B2 | 3/2013 | Brindle et al. | |

FOREIGN PATENT DOCUMENTS

| KR | 10-2012-0051035 A | 5/2012 |
| KR | 10-2012-0067275 A | 6/2012 |
| WO | WO 2011/014582 A2 | 2/2011 |

* cited by examiner

*Primary Examiner* — Kenneth B Wells
(74) *Attorney, Agent, or Firm* — NSIP Law

(57) ABSTRACT

An apparatus for determining an optimum stacking number of an RF switch, in which a gate-off voltage and a body-off voltage are used to control transistors stacked in series to enter an OFF state. The apparatus includes a memory configured to store a peak voltage of a high-frequency signal in a corresponding band, and a gate limiting voltage, a drain-source limiting voltage, and a body limiting voltage in a corresponding process for each of the transistors, and a processor configured to calculate a gate terminal voltage, a drain-source voltage, and a body terminal voltage using the peak voltage, the gate limiting voltage, the drain-source limiting voltage, and the body limiting voltage and to determine an optimum stacking number based on the gate terminal voltage, the gate limiting voltage, the drain-source voltage, the drain-source limiting voltage, the body terminal voltage, and the body limiting voltage.

19 Claims, 8 Drawing Sheets

APPARATUS AND METHOD FOR DETERMINING OPTIMUM STACK NUMBER OF RF SWITCH

CROSS-REFERENCE TO RELATED APPLICATIONS

This application claims the benefit under 35 U.S.C. § 119(a) of Korean Patent Application Nos. 10-2018-0024631 filed on Feb. 28, 2018 and 10-2018-0081875 filed on Jul. 13, 2018 in the Korean Intellectual Property Office, the entire disclosures of which are incorporated herein by reference for all purposes.

BACKGROUND

1. Field

The following description relates to an apparatus and a method of determining optimum stacking number of an RF switch.

2. Description of Background

In general, a power amplifier includes one or more radio frequency (RF) switches to select or cut off a corresponding band among a plurality of bands.

Such an RF switch may include a series switch and a shunt switch. As an example, when a signal passes from an RF input terminal to an RF output terminal, a field-effect transistor (FET) of the series switch is turned on, while FETs of the shunt switch are turned off. In this case, the shunt switch may cause a breakdown of the FET due to the intensity of a signal migrating from the RF input terminal to the RF output terminal, or an FET in an OFF state may be undesirably turned on to cause leakage of a signal. The breakdown or leakage causes P1dB and power handling capabilities to be lowered.

When the FET is in an ON state, a positive voltage (for example, +VDD) should be applied to a gate and a ground voltage (for example, 0 volt) should be applied to a body to reduce on-resistance Ron. When the FET is in an OFF state, a negative voltage (for example, −VDD) is applied to the gate and the body to prevent the FET from being turned on by a high signal. In this case, the FET may be prevented from being slightly turned on by the high signal.

Likewise, when the FET is controlled to enter an OFF state, a method of applying the negative voltage (for example, −VDD) to the gate and the body may prevent the FET from being even slightly turned on by a high signal. Therefore, the number of stacked FETs ("stacking number") may be determined in consideration of only a breakdown voltage of the FET.

For example, when a peak voltage Vpk of an RF signal is 10 Vpp and a single FET has a breakdown voltage of 2 volts, five stacks are optimal. However, there may be a situation in which a single FET cannot withstand 2 volts depending on the intensity of the gate voltage and, in this case, five or more stacks are required. Since the FET stack is not considered to be optimized, it is necessary to determine the optimal number of stacks in a corresponding design environment.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an apparatus for determining an optimum stacking number of an RF switch, in which a gate-off voltage and a body-off voltage are used to control transistors stacked in series to enter an OFF state. The apparatus includes a memory configured to store a peak voltage of a high-frequency signal in a corresponding band, and to store a gate limiting voltage, a drain-source limiting voltage, and a body limiting voltage in a corresponding process for each of the transistors, and a processor configured to calculate a gate terminal voltage, a drain-source voltage, and a body terminal voltage using the peak voltage, the gate limiting voltage, the drain-source limiting voltage, and the body limiting voltage stored in the memory and to determine an optimum stacking number based on the gate terminal voltage, the gate limiting voltage, the drain-source voltage, the drain-source limiting voltage, the body terminal voltage, and the body limiting voltage.

The processor may include an input unit configured to receive the peak voltage of the high-frequency signal, the gate limiting voltage, the drain-source limiting voltage, and the body limiting voltage from the memory, a voltage calculation unit configured to calculate the gate terminal voltage, the drain-source voltage, and the body terminal voltage using the peak voltage, the gate limiting voltage, the drain-source limiting voltage, and the body limiting voltage, a stacking number calculation unit configured to calculate a stacking number, satisfying a gate stacking number condition in which the gate terminal voltage is lower than the gate limiting voltage, to calculate a stacking number, satisfying a both end stacking number condition in which the drain-source voltage is lower than the drain-source limiting voltage, and to calculate a stacking number satisfying a body stacking number condition in which the body terminal voltage is lower than the body limiting voltage, and an optimum stacking number determination unit configured to determine the optimum stacking number based on a minimum stacking number among stacking numbers commonly satisfying the gate stacking number condition, the both end stacking number condition, and the body stacking number condition.

The optimum stacking number determination unit may determine the gate-off voltage and the body-off voltage corresponding to the optimum stacking number.

The optimum stacking number determination unit may determine the gate-off voltage and the body-off voltage satisfying a first condition, included in a predetermined negative voltage range, and a second condition, in which the body-off voltage is lower than the gate-off voltage, during determination of the gate-off voltage and the body-off voltage.

The gate terminal voltage may include a gate-drain voltage Vgd and a gate-source voltage Vgs, the body terminal voltage may include a body-drain voltage Vbd and a body-source voltage Vbs, the gate limiting voltage may include a gate-drain breakdown voltage BVGD and a gate-source threshold voltage Vth, the drain-source limiting voltage may be a drain-source breakdown voltage BVDSS, and the body limiting voltage may include a body-drain breakdown voltage BVbd and a body-source diode turn-on voltage Vdi.

The stacking number calculation unit may calculate a first stacking number N1, satisfying Equation 1, and a second stacking number N2, satisfying Equation 2, during calculation of a stacking number satisfying the gate stacking number condition, where $$BVGD>Vgd, BVGD>Vpk/2*(N1)-Vg, \quad \text{Equation 1:}$$

$$Vgs<Vth, Vpk/2*(N2)+Vg<Vth, \text{ and} \quad \text{Equation 2:}$$

Vpk is a peak voltage and Vg is the gate-off voltage.

The stacking number calculation unit may calculate a third stacking number N3, satisfying Equation 3, during calculation of a stacking number satisfying the both end stacking number condition, where $$Vds<BVDSS, (N3)>Vpk/(a*Vg+b), \text{ and} \quad \text{Equation 3:}$$

a is a negative constant and b is a positive constant.

The stacking number calculation unit may calculates a fourth stacking number N4, satisfying Equation 4, and a fifth stacking number N5, satisfying Equation 5, during calculation of a stacking number satisfying the body stacking number condition, where $$BVbd>Vbd, BVbd>Vpk/2*(N4)-Vb, \quad \text{Equation 4:}$$

$$Vbs<Vdi, Vpk/2*(N5)+Vb<Vdi, \text{ and} \quad \text{Equation 5:}$$

Vb is the body-off voltage.

The drain-source breakdown voltage BVDSS may satisfy Equation 6, where $$BVDSS=(a*Vg+b). \quad \text{Equation 6:}$$

According to another general aspect, a method for determining an optimum stacking number of an RF switch, in which a gate-off voltage and a body-off voltage are used to control transistors stacked in series to enter an OFF state. The method includes receiving a peak voltage of a high-frequency signal in a corresponding band, and a gate limiting voltage, a drain-source limiting voltage, and a body limiting voltage in a corresponding process for each of the transistors, calculating a gate terminal voltage, a drain-source voltage, and a body terminal voltage of each of the transistors, calculating a stacking number satisfying a gate stacking number condition in which the gate terminal voltage is lower than the gate limiting voltage, calculating a stacking number satisfying a both end stacking number condition in which the drain-source voltage is lower than the drain-source limiting voltage, calculating a stacking number satisfying a body stacking number condition in which the body terminal voltage is lower than the body limiting voltage, and determining the optimum stacking number based on a minimum stacking number among stacking numbers commonly satisfying the gate stacking number condition, the both end stacking number condition, and the body stacking number condition.

The determining an optimum stacking number may determine the gate-off voltage and the body-off voltage corresponding to the optimum stacking number.

The determining an optimum stacking number may determine the gate-off voltage and the body-off voltage satisfying a first condition, included in a predetermined negative voltage range, and a second condition, in which the body-off voltage is lower than the gate-off voltage, during determination of the gate-off voltage and the body-off voltage.

The gate terminal voltage includes a gate-drain voltage Vgd and a gate-source voltage Vgs, the body terminal voltage may include a body-drain voltage Vbd and a body-source voltage Vbs, the gate limiting voltage may include a gate-drain breakdown voltage BVGD and a gate-source threshold voltage Vth, the drain-source limiting voltage may be a drain-source breakdown voltage BVDSS, and the body limiting voltage may include a body-drain breakdown voltage BVbd and a body-source diode turn-on voltage Vdi.

The calculating a stacking number satisfying the gate stacking number condition may calculate a first stacking number N1, satisfying Equation 1, and a second stacking number N2, satisfying Equation 2, during calculation of a stacking number satisfying the gate stacking number condition, where $$BVGD>Vgd, BVGD>Vpk/2*(N1)-Vg, \quad \text{Equation 1:}$$

$$Vgs<Vth, Vpk/2*(N2)+Vg<Vth, \text{ and} \quad \text{Equation 2:}$$

Vpk is a peak voltage and Vg is the gate-off voltage.

The calculating a stacking number satisfying the both end stacking number condition may calculate a third stacking number N3, satisfying Equation 3, during calculation of a stacking number satisfying the both end stacking number condition, where $$Vds<BVDSS, (N3)>Vpk/(a*Vg+b), \text{ and} \quad \text{Equation 3:}$$

a is a negative constant and b is a positive constant.

The calculating a stacking number satisfying the body stacking number condition may calculate a fourth stacking number N4, satisfying Equation 4, and a fifth stacking number N5, satisfying Equation 5, during calculation of a stacking number satisfying the body stacking number condition, where $$BVbd>Vbd, BVbd>Vpk/2*(N4)-Vb, \quad \text{Equation 4:}$$

$$Vbs<Vdi, Vpk/2*(N5)+Vb<Vdi, \text{ and} \quad \text{Equation 5:}$$

Vb is the body-off voltage.

The drain-source breakdown voltage BVDSS may satisfy Equation 6, where $$BVDSS=(a*Vg+b). \quad \text{Equation 6:}$$

In another general aspect, an apparatus includes a memory configured to store a peak voltage of a high-frequency signal and limiting voltages associated with transistors, a processor configured to calculate terminal voltages based on the limiting voltages stored in the memory and to determine an optimum stacking number of the transistors based on the limiting voltages and the terminal voltages, and a voltage generator configured to generate a gate-off voltage and a body-off voltage corresponding to the optimum stacking number determined by the processor.

The transistors may be stacked in series in a radio frequency switch and the gate-off voltage and the body-off voltage may be used to control the transistors to enter an OFF state.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
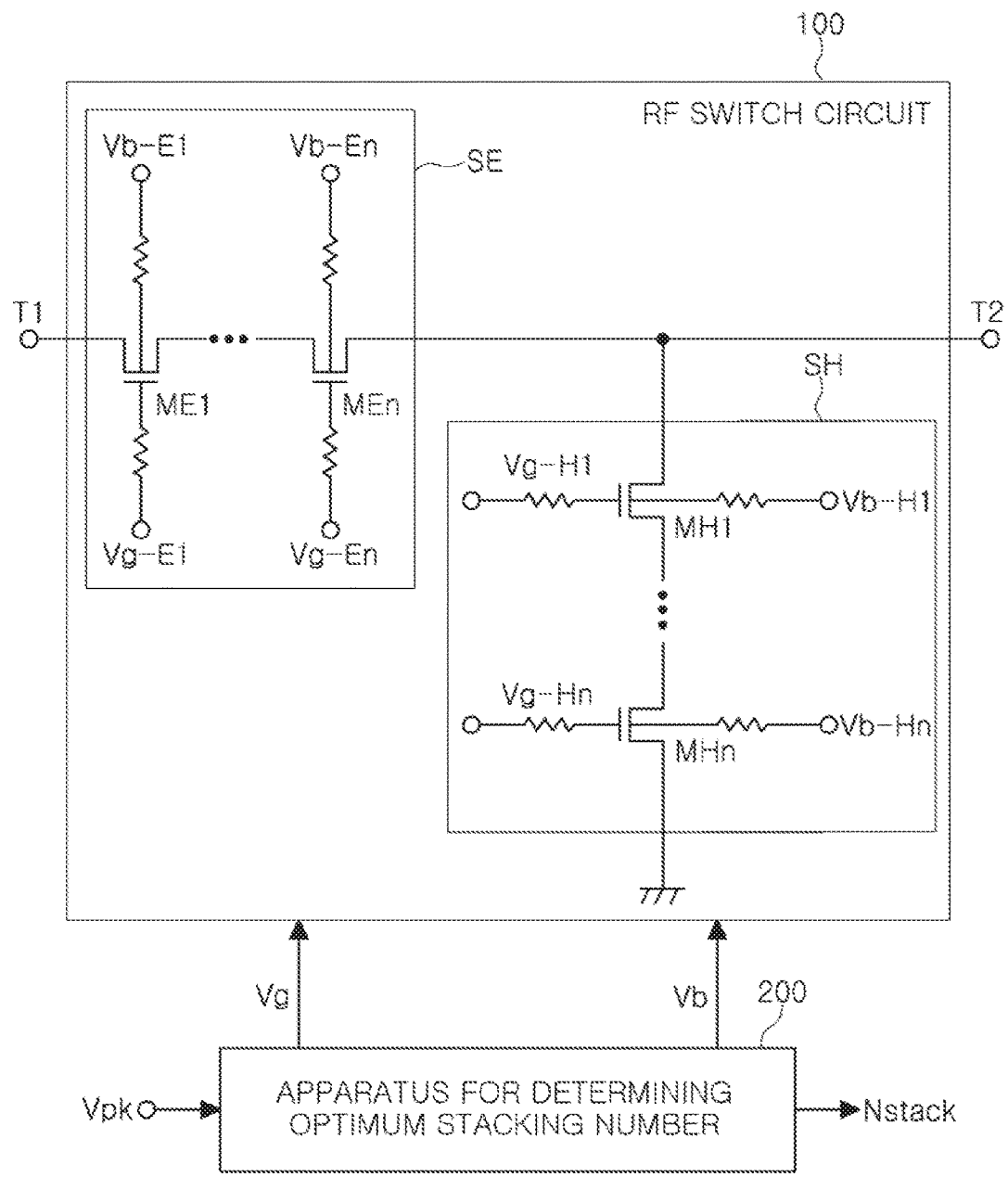
FIG. 1 is a conceptual diagram of an apparatus for determining optimum stacking number of an RF switch according to an example.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Figure 2:
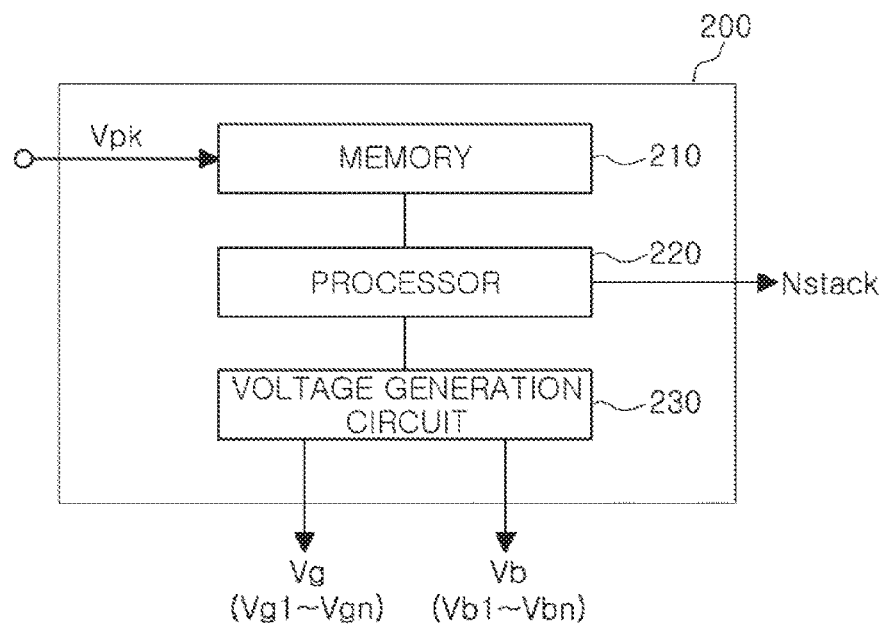
FIG. 2 is a block diagram of an apparatus for determining optimum stacking number according to an example.

FIG. 1 is a conceptual diagram of an apparatus for determining optimum stacking number of an RF switch according to an example, and FIG. 2 is a block diagram of an apparatus for determining optimum stacking number according to an example.

Referring to FIGS. 1 and 2, an RF switch, to which an apparatus 200 for determining optimum stacking number is applied, may include, for example, a series switch SE including a plurality of transistors ME1 to MEn, stacked in series, and a shunt switch SH including a plurality of transistors MH1 to MHn stacked in series. Gate voltages Vg-E1 to Vg-En and body voltages Vb-E1 to Vb-En are applied to gates and bodies of the plurality of transistors ME1 to MEn, respectively. Gate voltages Vg-H1 to Vg-Hn and body voltages Vb-H1 to Vb-Hn are applied to gates and bodies of the plurality of transistors MH1 to MHn, respectively. The gate voltage includes a gate-on voltage for controlling a corresponding transistor to enter an ON state and a gate-off voltage for controlling a corresponding transistor to enter an OFF state. The body voltage includes a body-on voltage for controlling a corresponding transistor to enter an ON state and a body-off voltage for controlling a corresponding transistor to enter an OFF state.

The apparatus 200 may determine optimum stacking number Nstack of an RF switch using a gate-off voltage and a body-off voltage in such a manner that the series switch SE or the shunt switch SH are controlled to enter an OFF state.

Optimum stacking number Nstack of an RF switch is determined as minimum stacking number satisfying a plurality of conditions (a gate stacking number condition, a both end stacking number condition, and a body stacking number condition), considering a gate-off voltage, a body-off voltage, a limiting voltage, and a relationship with the gate-off voltage and the body-off voltage, when a switch circuit including a plurality of FETs is in an OFF state.

Referring to FIG. 2, the apparatus 200 may include a memory 210, a processor 220, and a voltage generation circuit 230.

The memory 210 may store a peak voltage Vpk of a high-frequency signal in a corresponding band or a predetermined band of a multi-band, gate limiting voltages BVGD and Vth, a drain-source limiting voltage BVDSS, and body limiting voltages BVbd and Vdi in a corresponding process for each of a plurality of transistors.

As an example, the gate limiting voltages BVGD and Vth are a gate-drain breakdown voltage BVGD and a gate-source threshold voltage Vth. The drain-source limiting voltage BVDSS is a drain-source breakdown voltage BVDSS. The body limiting voltages BVbd and Vdi are a body-drain breakdown voltage BVbd and a body-source diode turn-on voltage Vdi. The peak voltage Vpk refers to a peak voltage of a signal, which should be handled, in a structure including a plurality of transistors stacked.

The processor 220 may calculate gate terminal voltages Vgd and Vgs, a drain-source voltage Vds, and body terminal voltages Vbs and Vgs using the peak voltage Vpk, the gate limiting voltages BVGD and Vth, the drain-source limiting voltage BVDSS, and the body limiting voltages BVbd and Vdi stored in the memory 210, and may determine optimum stacking number based on the limiting voltages and the terminal voltages.

As an example, the gate terminal voltages Vgd and Vgs are a gate-drain voltage Vgd and a gate-source voltage Vgs. The body terminal voltages Vbs and Vbd are a body-drain voltage Vbd and a body-source voltage Vbs. The gate limiting voltages BVDG and Vth are a gate-drain breakdown voltage BVGD and a gate-source threshold voltage Vth.

The voltage generation circuit 230 may generate a predetermined gate-on voltage (for example, +VDD) and a body-on voltage (for example, 0V), and may generate a gate-off voltage Vg and a body-off voltage Vb corresponding to optimum stacking number determined by the processor 220.

Figure 3:
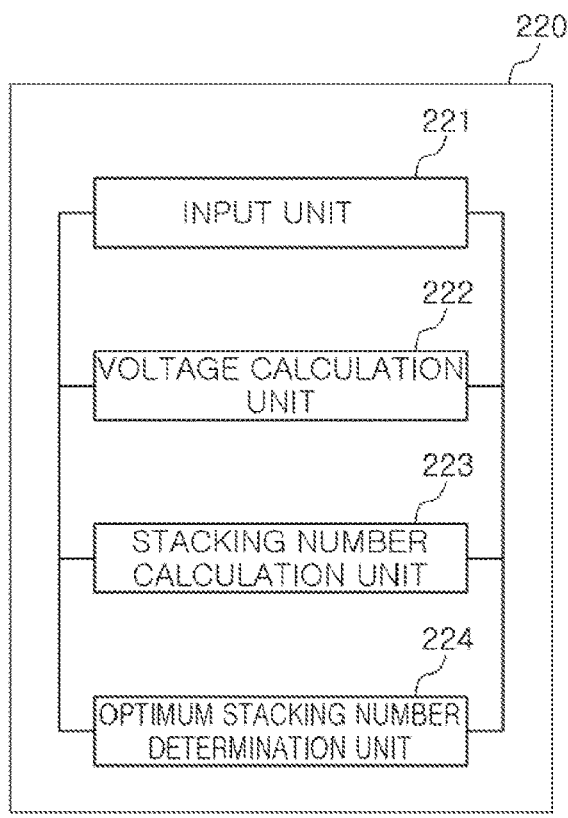
FIG. 3 is a block diagram of a processor in FIG. 2.

FIG. 3 is a block diagram of a processor in FIG. 2.

Referring to FIGS. 1 to 3, the processor 220 may include an input unit 221, a voltage calculation unit 222, a stacking number calculation unit 223, and an optimum stacking number determination unit 224.

The input unit 221 receives the peak voltage Vpk of the signal, the gate limiting voltages BVGD and Vth, the drain-source limiting voltage BVDSS, and the body limiting voltages BVdb and Vdi from the memory 210.

The voltage calculation unit 222 calculates the gate terminal voltages Vgd and Vgs, the drain-source voltage Vds, and the body terminal voltages Vbs and Vbd using the peak voltage Vpk, the gate limiting voltages BVGD and Vth, the drain-source limiting voltage BVDSS, and the body limiting voltages BVdb and Vdi.

The stacking number calculating unit 223 calculates stacking numbers N1 and N2 satisfying a gate stacking number condition in which the gate terminal voltages Vgd and Vgs are less than the gate limiting voltages BVGD and Vth, calculates a stacking number N3 satisfying a both end stacking number condition in which the drain-source voltage Vds is less than the drain-source limiting voltage BVDSS, and calculates stacking numbers N4 and N5 satisfying a body stacking number condition in which the body terminal voltages Vbs and Vbd are less than the body limiting voltages BVdb and Vdi. The gate stacking number condition, the both end stacking number condition, and the body stacking number condition will be described later.

The optimum stacking number determination unit 224 determines an optimum stacking number corresponding to a minimum stacking number, among stacking numbers commonly satisfying the gate stacking number condition, the both end stacking number condition, and the body stacking number condition. As an example, the optimum stacking number determination unit 224 determines the gate-off voltage Vg and the body-off voltage Vb corresponding to the optimum stacking number. The optimum stacking number determination unit 224 determines the gate-off voltage Vg and the body-off voltage Vb, satisfying both a first condition included in a predetermined negative voltage range (greater than −VDD and less than 0 volt)(Vg, Vb ⊂ (−VDD~0V)) and a second condition in which the body-off voltage Vb is lower than the gate-off voltage Vg (Vb<Vg). The second condition will be described later with reference to FIG. 13.

A method of determining an optimum stacking number, performed in the processor 220, will now be described with reference to FIGS. 4 to 12. A description of an apparatus for determining an optimum stacking number and description of a method for determining an optimum stacking number may be complementary to each other, unless otherwise specified. For example, the description of the apparatus made with reference to FIGS. 1 to 3 may be applied to the description of the method. Accordingly, in the description of the method for determining an optimum stacking number, duplicate detailed explanations will be omitted.

Figure 4:
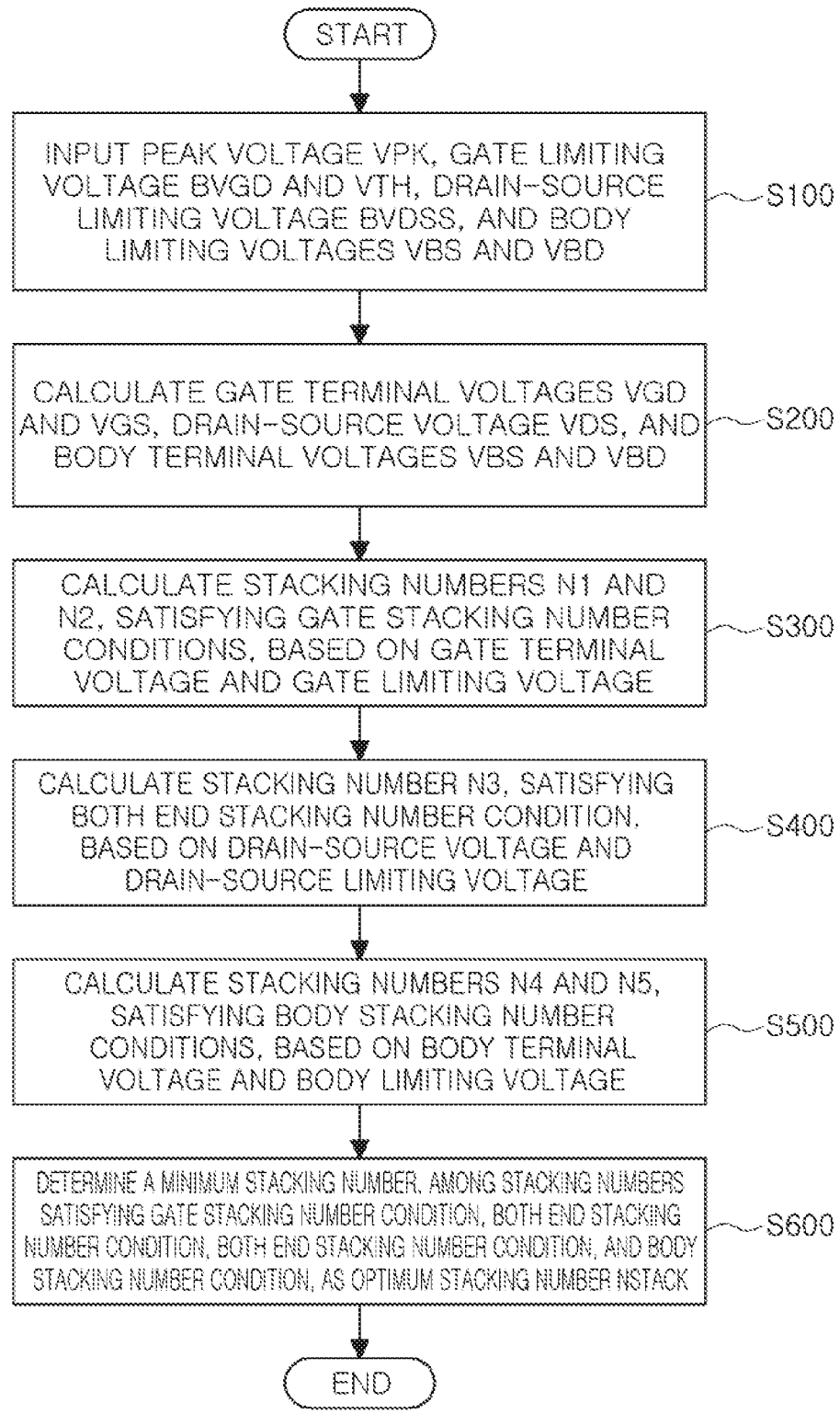
FIG. 4 is a flowchart illustrating a method for determining optimum stacking number according to an example.

FIG. 4 is a flowchart illustrating a method for determining optimum stacking number according to an example. Referring to FIG. 4, a method for determining an optimum stacking number according to an example will now be described.

In operation S100, the processor 220 receives a peak voltage Vpk of a high-frequency signal in a corresponding band, and gate limiting voltages BVGD and Vth, a drain-source limiting voltage BVDSS, and body limiting voltages BVbd and Vdi in a corresponding process for each of a plurality of transistors. As an example, the gate limiting voltages BVGD and Vth are a gate-drain breakdown voltage BVGD and a gate-source threshold voltage Vth. The drain-source limiting voltage BVDSS is a drain-source breakdown voltage BVDSS. The body limiting voltages BVbd and Vdi are a body-drain breakdown voltage BVbd and a body-source diode turn-on voltage Vdi.

In operation S200, the processor 220 increases stacking numbers, based on the peak voltage Vpk, and calculates gate terminal voltages Vgd and Vgs, a drain-source voltage Vds, body terminal voltages Vbs and Vbd of one of the plurality of transistors with respect to the respective stacking numbers. As an example, the gate terminal voltages Vgd and Vgs are a gate-drain voltage Vgd and a gate-source voltage Vgs.

The body terminal voltages Vbs and Vbd are a body-drain voltage Vbd and a body-source voltage Vbs. The gate limiting voltages BVGD and Vth are a gate-drain breakdown voltage BVGD and a gate-source threshold voltage Vth.

In operation S300, the processor 220 calculates stacks numbers N1 and N2 satisfying a gate stacking number condition in which the gate terminal voltages Vgd and Vgs are lower than the gate limiting voltages BVGD and Vth, which will be described later with reference to FIGS. 7 and 10.

In operation S400, the processor 220 calculates a stacking number N3 satisfying a both end stacking number condition in which the drain-source voltage Vds is lower than the drain-source limiting voltage BVDSS, which will be described later with reference to FIGS. 9 and 10.

In operation S500, the processor 220 calculates stacking numbers N4 and N5 satisfying a body stacking number condition in which the body terminal voltages Vbs and Vbd are lower than the body limiting voltages BVbd and Vdi, which will be described later with reference to FIGS. 8 and 11.

In operation S600, the processor 220 determines an optimum stacking number corresponding to a minimum stacking number among stacking numbers which commonly satisfy the gate stacking number condition, the both end stacking number condition, and the body stacking number condition, which will be described later with reference to FIGS. 7 to 11.

In operation S600, to determine the optimum stacking number, the gate-off voltage Vg and the body-off voltage Vb corresponding to the optimum stacking number may be determined.

Also in operation S600, to determine the optimum stacking number, the gate-off voltage Vg and the body-off voltage Vb, satisfying both a first condition included in a predetermined negative voltage range (greater than −VDD and less than 0 volt) and a second condition in which the body-off voltage Vb is lower than the gate-off voltage Vg, may be determined. The second condition will be described later with reference to FIG. 13.

Figure 5:
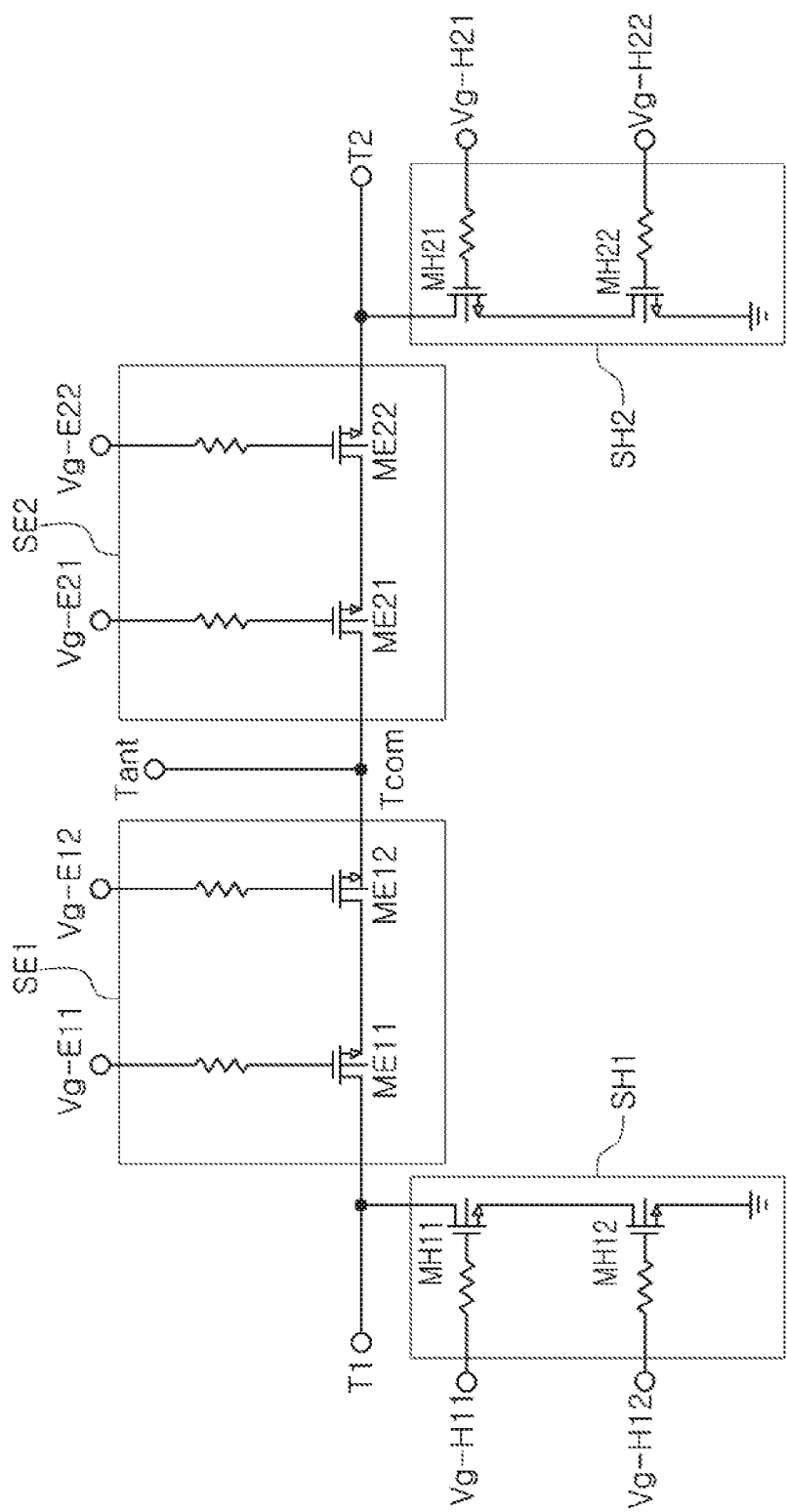
FIG. 5 illustrates a single pole double throw (SPDT) RF switch to which an example is applicable.

FIG. 5 illustrates a single pole double throw (SPDT) RF switch to which an example is applicable.

Referring to FIG. 5, an operation of an RF switch will now be described. When a signal passes through an antenna terminal Tant from a first terminal T1 via a common terminal Tcom, FETs ME11 and ME12 of a first series switch SE1 are turned on, while FETs ME21 and ME22 of a second series switch SE2 are turned off. FETs MH11 and MH12 of a first shunt switch SH1 are turned off, while FETs MH21 and MH22 of a second shunt switch SH2 are turned on. A plurality of series gate voltages Vg-E11, Vg-E12, Vg-E21, and Vg-E22 and a plurality of series shunt gate voltages Vg-H11, Vg-H12, Vg-H21, and Vg-H22 are shown in FIG. 5.

An example of an RF switch, to which the apparatus and the method of the examples described herein may be applied, is shown in FIG. 1, but the disclosure is not limited to such examples. The apparatus and the method may be applied to single pole double throw (SPDT), single pole multiple through (SPMT), and the like. Likewise, the apparatus and the method may be applied to a switch including a plurality of transistors stacked in series, irrespective of a structure or a shape of an RF switch.

In the second shunt switch SH2, an FET may be broken down or an OFF-state FET may be slightly turned on by the intensity of a signal migrating from the first terminal T1 to the antenna terminal (third terminal) Tant to cause signal leakage.

Due to these phenomena, P1dB may be reduced and power handling capabilities may be degraded. Accordingly, it is necessary to determine a gate-off voltage, a gate body voltage, and an optimum stacking number.

As set forth above, an optimum stacking number of an RF switch is defined by a minimum stacking number, satisfying a plurality of conditions considering a gate-off voltage, a body-off voltage, a limiting voltage, and a relationship between the gate-off voltage and the body-off voltage, when a switch circuit including a plurality of FET stacks is in an OFF state.

Figure 6:
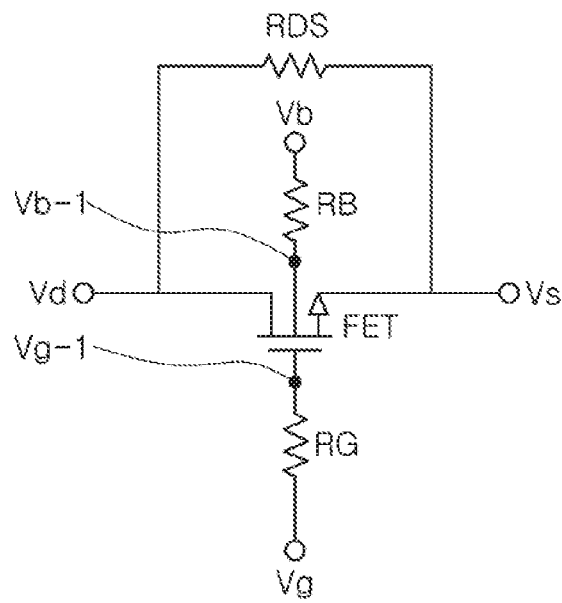
FIG. 6 is an illustration of an FET of an RF switch according to an example.

FIG. 6 is an illustration of an FET of an RF switch according to an example.

Referring to FIG. 6, a gate voltage and a body voltage of an RF switch will now be described. When an FET is in an ON state, a gate-on voltage Vg should be applied as a positive voltage (for example, +VDD) and a body-on voltage Vb should be applied as a ground voltage (for example, VSS) to decrease on-resistance Ron. When the FET is in an OFF state, a negative voltage (for example, −VDD) is applied to both a gate and a body to prevent the FET from being turned on by a high signal. In this case, the FET may be prevented from being even slightly turned on by the high signal.

In addition, when the FET is controlled to be in the OFF state, a method of applying the negative voltage −VDD to the gate and the body may prevent the FET from being even slightly turned on by the high signal. Thus, the FET stacking number may be determined in consideration of only a breakdown voltage of the FET. However, since a method of using the negative voltage −VDD as an off voltage causes the number of required stacks to be increased more than when an off-voltage is suitably adjusted, insertion loss (IL) may be significantly increased.

An operation power definition of an RF switch will now be described. A piece of user equipment (UE) may transmit a maximum of 23 dBm, while a piece of high-power user equipment (HPUE) may transmit a maximum of 31 dBm. As an example, when power of 31 dBm is applied to an off switch, an FET of one end applied with a voltage may be checked to confirm a peak voltage Vpk through power conversion. For example, a unit of power P and the peak voltage Vpk may change from miliwatt (mW) to dBm.

As an example, considering a peak to average power ratio (PAPR) is about 7 dB when an output voltage of a power amplifier PA is 31 dBm, in the case in which power P is 6.31 watts and impedance used in the power amplifier PA is 50 ohms, a peak voltage Vpk may be 25.2 volts (V).

Accordingly, when RF power of 38 dBm is 25.2 Vpk and is applied to an RF switch in which N FETs are stacked, a voltage of 25.2/N is applied to a single FET drain and source. Equations set forth below will illustrate a case in which a peak voltage Vpk is 25.2 Vpp assuming that an output y is 38 dBm.

Figure 7:
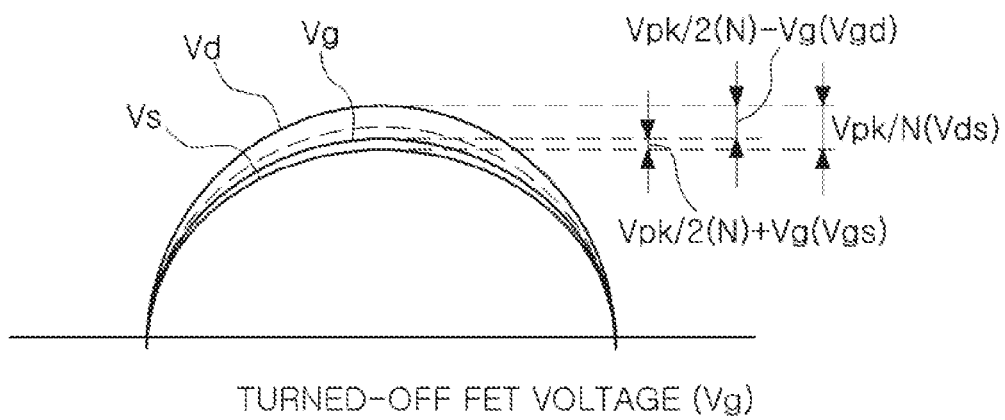
FIG. 7 is an illustration of a gate off voltage Vg of an OFF-state FET of an RF switch according to an example.

FIG. 7 is an illustration of a gate off voltage Vg of an OFF-state FET of an RF switch according to an example.

Referring to FIGS. 6 and 7, a gate-off voltage Vg of an OFF-state FET in an RF switch will now be described. A voltage is applied to the OFF-state FET, as shown in FIG. 7. In FIG. 7, N denotes a stacking number, which includes N1 to N5 used to distinguish the equations in the examples from each other.

Referring to FIG. 7, in the case in which a gate-off voltage is applied to a gate when an FET is in an OFF state, Equation 1 and Equation 2 should be satisfied during calculation of the stacking number satisfying the gate stacking number condition.

A first stacking number N1 satisfying Equation 1 and a second stacking number N2 satisfying Equation 2 may be obtained.

$$BVGD>Vgd, BVGD>Vpk/2*(N1)-Vg \qquad \text{Equation 1:}$$

$$Vgs<Vth, Vpk/2*(N2)+Vg<Vth \qquad \text{Equation 2:}$$

In Equation 1, in the case in which a gate voltage Vg=−2.5 V, a gate-drain breakdown voltage BVGD=8.5 V, and a threshold voltage Vth=0.43 V, if they are substituted into Equation 1 (BVGD>Vpk/2*(N1)−Vg), 8.5 V>Vpk/2*(N1)−(−2.5 V) and N1 (first stacking number)>2.1.

In Equation 2, in the case in which Vg=−2.5 V, BVGD=8.5 V, and Vth=0.43 V, N2>4.3 in Equation 2 (Vpk/2*(N2)+Vg<Vth).

It can be seen that the stacking number, satisfying both conditions of Equation 1 and Equation 2, is five or more.

To describe further, it is assumed that an output y is 38 dBm at a load of 50 ohms, BVdg=8.5 V, and Vth=0.43 V. When the gate-off voltage is −2.5 V, five stacks or more are required and a dominant factor is Vth. For example, when the gate-off voltage is increased to be higher than −2.5 V, the FET is slightly turned on and leakage occurs at a voltage at which Vgs is increased to be higher than Vth.

For example, when the gate-off voltage is increased, the stacking number N2 is increased by Vth that is the dominant factor, which will be additionally described when a drain to source breakdown voltage (BVDSS) is described.

Moreover, the operation S400 to calculate the stacking number satisfying the both end stacking number condition may calculate a third stacking number N3 satisfying Equation 3.

$$Vds<BVDSS, BVDSS(=(a*Vg+b))>Vpk/(N3) \qquad \text{Equation 3:}$$

Figure 8:
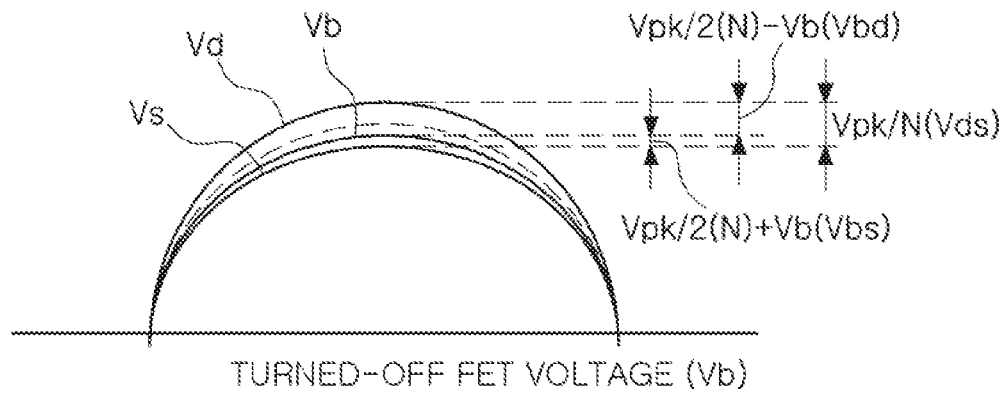
FIG. 8 illustrates a body off voltage Vb of an OFF-state FET of an RF switch according to an example.

FIG. 8 illustrates a body off voltage Vb of an OFF-state FET of an RF switch according to an example.

Referring to FIGS. 6 and 8, a body-off voltage of an OFF-state FET will now be described. In an RF switch in which N FETs are stacked, when a body-off voltage Vb is applied to a body while the FET is in an OFF state, Equation 4 and Equation 5 should be satisfied during calculation of a stacking number satisfying the body stacking number condition.

A fourth stacking number N4 satisfying Equation 4 and a fifth stacking number satisfying Equation 5 may be obtained.

$$BVbd>Vbd, BVbd>Vpk/2*(N4)-Vb \qquad \text{Equation 4:}$$

$$Vbs<Vdi, Vpk/2*(N5)+Vb<Vdi \qquad \text{Equation 5:}$$

In Equation 4, in the case in which Vg=−2.5 V, BVGD=3.5 V, and Vth=0.67 V, 3.5V>Vpk/2*(N4)−(−2.5V) and N4>12.6 when BVbd>Vpk/2*(N4)−Vb.

In Equation 5, in the case in which Vb=−2.5 V, BVbd=3.5 V, Vdi=0.6 V, N5>4.1 when Vpk/2*(N5)+Vb<Vdi.

It can be seen that a stacking number, satisfying both conditions of Equation 4 and Equation 5, is 13 or more.

To describe further, it is assumed that an output y is 38 dBm at a load of 50 ohms, BVbd=3.5 V, and Vdi=0.6 V. When the body-off voltage is −2.5 V, 13 stack or more are required and a dominant factor is BVbd. When the body-off voltage is decreased, an FET is broken down and leakage occurs at a voltage at which Vbd is increased to be higher than BVbd. For example, when the body-off voltage is decreased, a fourth stacking number N4 is increased by the BVbd that is the dominant factor. Meanwhile, when the body-off voltage is increased, a junction diode is turned on at a point, at which the body-off voltage is increased to be higher than Vdi, to cause leakage. Accordingly, an appropriate body-off voltage may be selected in consideration of the stacking numbers N1, N2, N3, N4, and N5 to obtain an optimum stacking number.

Figure 9:
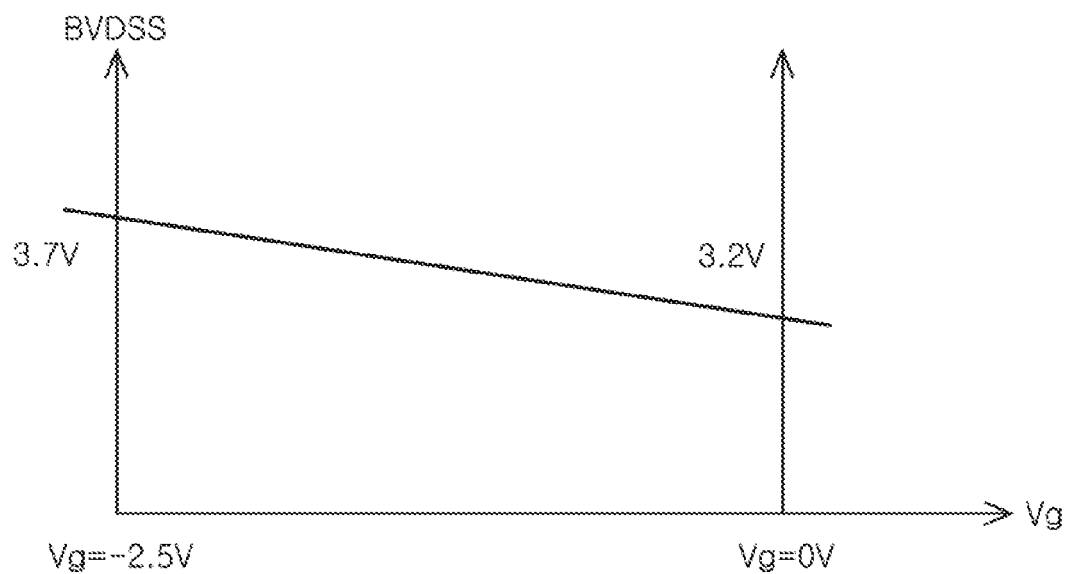
FIG. 9 is an approximation graph of a source-drain breakdown voltage BVDSS depending on a gate off voltage Vg of an RF switch according to an example.

FIG. 9 is an approximation graph of a source-drain breakdown voltage BVDSS depending on a gate off voltage Vg of an RF switch according to an example.

Referring to FIG. 9, BVDSS will now be described. In an FET which is in an OFF state, another considering breakdown is BVDSS, as shown in Equation 3. The BVDSS is defined as a drain voltage, to which a small current (for example, 1 µA/µm) flows, when a gate-source voltage of 0 V is applied and a drain voltage is increased and may be, for example, about 3.2 V although it varies depending on a process.

When a gate voltage Vg is a negative voltage, Ids leakage is reduced to increase BVDSS. The BVDSS increases by about 0.5 V when Vg=−2.5 V. Based thereon, the BVDSS depending on Vg may be approximated, and a relationship between the BVDSS and the Vg may be approximated, as shown in Equation 6.

$$BVDSS=(a*Vg+b) \qquad \text{Equation 6:}$$

In Equation 6, 'a' denotes a negative constant (for example, −0.2) and 'b' is a positive constant (for example, +3.2).

Figure 10:
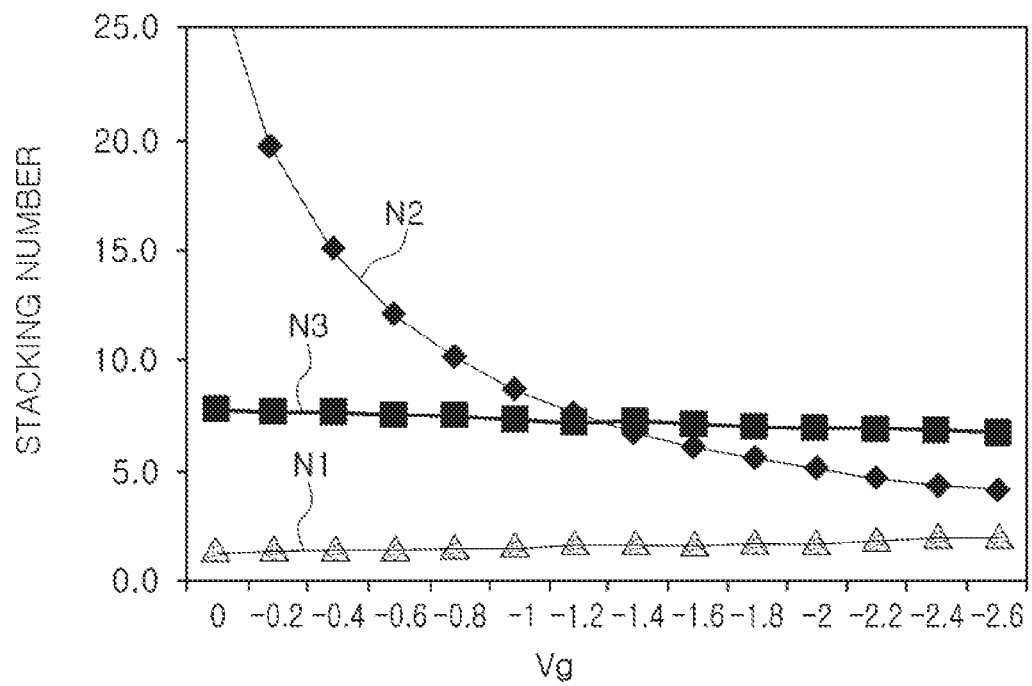
FIG. 10 is a graph illustrating an optimum stacking number depending on a gate-off voltage Vg of an RF switch according to an example.

FIG. 10 is a graph illustrating an optimum stacking number depending on a gate-off voltage Vg of an RF switch according to an example.

Referring to FIG. 10, an optimization of an FET stacking number will now be described. In relation to a gate-off voltage Vg, an optimization of a stacking number depending on a gate-off voltage is as follows. During calculation of a stacking number satisfying the gate stacking number condition, a first stacking number N1 and a second stacking number N2 may be obtained from Equation 7 and Equation 8 which are converted versions of Equation 1 and Equation 2, respectively.

$$N1>Vpk/[2*(BVGD+Vg)], BVGD>Vgd \qquad \text{Equation 7:}$$

$$N2>Vpk/[2*(Vth-Vg)], Vgs<Vth \qquad \text{Equation 8:}$$

In addition, an optimization of a stacking number depending on a drain-source voltage will now be described. A stacking number N3 may be obtained from Equation 9, which is a converted version of Equation 3, corresponding to the both end stacking number.

$$N3>Vpk/((a*Vg+b)), Vds<BVDSS \qquad \text{Equation 9:}$$

In Equation 9, 'a' may be −0.2 and 'b' may be 3.2.

Figure 11:
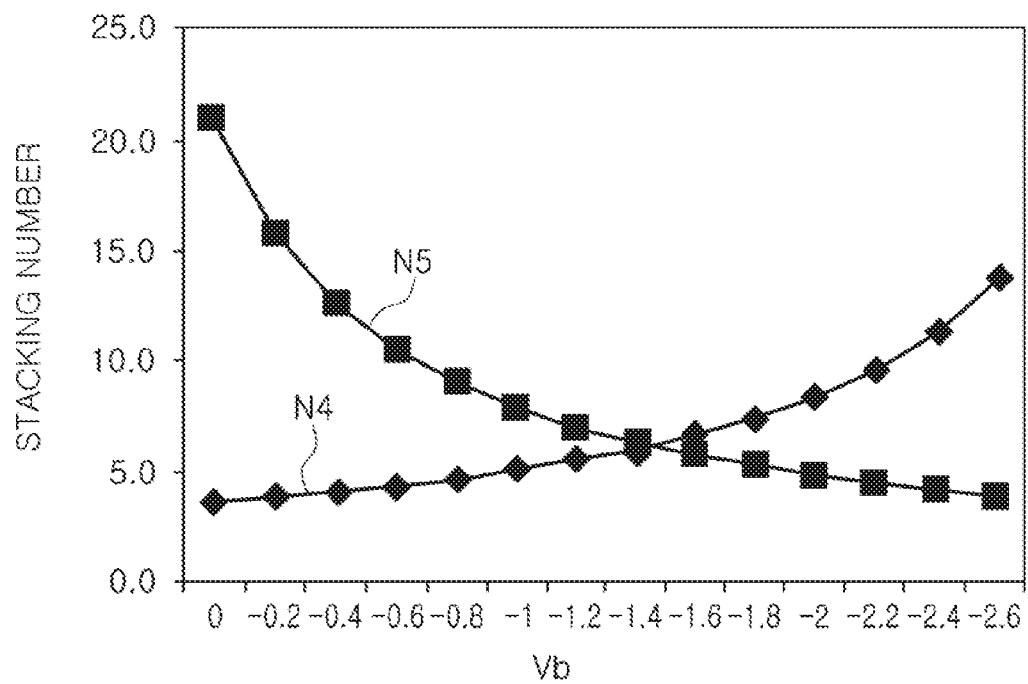
FIG. 11 is a graph illustrating an optimum stacking number depending on a body off voltage Vb of an RF switch according to an example.

FIG. 11 is a graph illustrating an optimum stacking number depending on a body off voltage Vb of an RF switch according to an example Referring to FIG. 11, among the optimizations of FET stacking number of the RF switch, an optimization of a stacking number depending on a body-off voltage will now be described. A fourth stacking number N4 and a fifth stacking number N5 may be obtained from Equation 10 and Equation 11, which are respectively converted versions of Equation 4 and Equation 5, corresponding to the body stacking number condition.

$$N4>Vpk/[2*(BVbd+Vb)], BVbd>Vbd \qquad \text{Equation 10:}$$

$$N5>Vpk/[2*(Vdi-Vb)], Vbs<Vdi \qquad \text{Equation 11:}$$

Examples of the respective stacking numbers will now be described with reference to Equation 7 to Equation 11 set forth above.

A stacking number depending on a gate-off voltage Vg is described first. A first stacking number N1, a second stacking number N2, and a third stacking number N3 may be obtained using Equation 7, Equation 8, and Equation 9 when Vpk=25.2 V, Vg=−2.5 V, BVGD=8.5 V, and Vth=0.43 V.

Example of Calculating First Stacking Number N1 Using Equation 7
 (1) when being applied to N1>Vpk/(2*(BVGD+Vg)),
 (2) N1>25.2/(2*(8.5+(−2.5)))=25.2/(12)
 (3) N1>2.1, i.e., N1=3

Example of Calculating Second Stacking Number N2 Using Equation 8
 (1) N2>Vpk/(2*(Vth−Vg))
 (2) N2>25.2/(2*(0.43−(−2.5)))=25.2/(5.86)
 (3) N2>4.3, i.e., N2=5

Example of Calculating Third Stacking Number N3 Using Equation 9
 (1) In the case in which N3>Vpk/(a*Vg+b), 'a' is −0.2, and 'b' is 3.2,
 (2) N3>25.2/(((−0.2)*(−2.5)+(3.2)))=25.2/(3.7)
 (3) N3>6.8, i.e., N3=7

Referring to the stacking numbers obtained using Equation 7, Equation 8, and Equation 9, a stacking number depending on the gate-off voltage Vg may be optimized by Equation 7, Equation 8, and Equation 9.

As described above, when the output y is 38 dBm and BVbd=8.5 V, Vth=0.5, and BVDSS=(−0.2*Vg+3.2) at RF power, stacking numbers depending on the gate-off voltage Vg, satisfying the conditions established by Equation 7, Equation 8, and Equation 9, are shown in Table 1 and FIG. 10.

TABLE 1

| Vg | Vth N2 | BVDSS N3 | BVGD N1 |
|---|---|---|---|
| 0 | 29.3 | 7.9 | 1.5 |
| −0.2 | 20.0 | 7.8 | 1.5 |
| −0.4 | 15.2 | 7.7 | 1.6 |
| −0.6 | 12.2 | 7.6 | 1.6 |
| −0.8 | 10.2 | 7.5 | 1.6 |
| −1 | 8.8 | 7.4 | 1.7 |
| −1.2 | 7.7 | 7.3 | 1.7 |
| −1.4 | 6.9 | 7.2 | 1.8 |
| −1.6 | 6.2 | 7.2 | 1.8 |
| −1.8 | 5.7 | 7.1 | 1.9 |
| −2 | 5.2 | 7.0 | 1.9 |
| −2.2 | 4.8 | 6.9 | 2.0 |
| −2.4 | 4.5 | 6.8 | 2.1 |
| −2.6 | 4.2 | 6.8 | 2.1 |

As can be seen from Table 1, the lower the gate-off voltage Vg, the smaller the stacking number. Since a stacking number satisfying both the gate stacking number condition and the both end stacking number condition is seven (7), the gate-off voltage Vg is −2.6 V to −2 V and an optimum stacking number is seven (7).

Next, a stacking number depending on the body-off voltage Vb will now be described. In the case in which Vpk=25.2 V, Vb=−1.4 V, BVbd=3.5 V, and Vdi=0.6 V, the fourth stacking number N4 and the fifth stacking number N5 may be obtained suing Equation 10 and Equation 11.

Example of Calculating Fourth Stacking Number N4 Using Equation 10
 (1) N4>Vpk/(2*(BVbd+Vb))
 (2) N4>25.2/(2*(3.5+(−1.4)))=25.2/(4.2)
 (3) N4>6, i.e., N4=7

Example of Calculating Fifth Stacking Number N5 Using Equation 11
 (1) N5>Vpk/(2*(Vdi−Vb))
 (2) N5>25.2/(2*(0.6−(−1.4)))=25.2/(4)
 (3) N5>6.3, i.e., N5=7

Referring to the stacking numbers calculated using Equation 10 and Equation 11, the stacking number depending on the body-off voltage Vb may be optimized by Equation 10 and Equation 11.

As described above, when the output y is 38 dBm and BVbd (or BVBD)=3.5 V, Vth=0.6 at RF power, stacking numbers depending on the body-off voltage Vb, satisfying the conditions established by Equation 10 and Equation 11, are shown in Table 2 and FIG. 11.

TABLE 2

| Vb | BVbd N4 | Vdi N5 |
|---|---|---|
| 0 | 3.6 | 21.0 |
| −0.2 | 3.8 | 15.8 |
| −0.4 | 4.1 | 12.6 |
| −0.6 | 4.3 | 10.5 |
| −0.8 | 4.7 | 9.0 |
| −1 | 5.0 | 7.9 |
| −1.2 | 5.5 | 7.0 |
| −1.4 | 6.0 | 6.3 |
| −1.6 | 6.6 | 5.7 |
| −1.8 | 7.4 | 5.3 |
| −2 | 8.4 | 4.8 |
| −2.2 | 9.7 | 4.5 |
| −2.4 | 11.5 | 4.2 |
| −2.6 | 14.0 | 3.9 |

As can be seen from Table 2, the lower the body-off voltage Vb, the greater the stacking number. Since a stacking number satisfying both the body stacking number condition is seven (7), the body-off voltage Vb is −1.6 V to −1.4 V and an optimum stacking number is seven (7).

Figure 12:
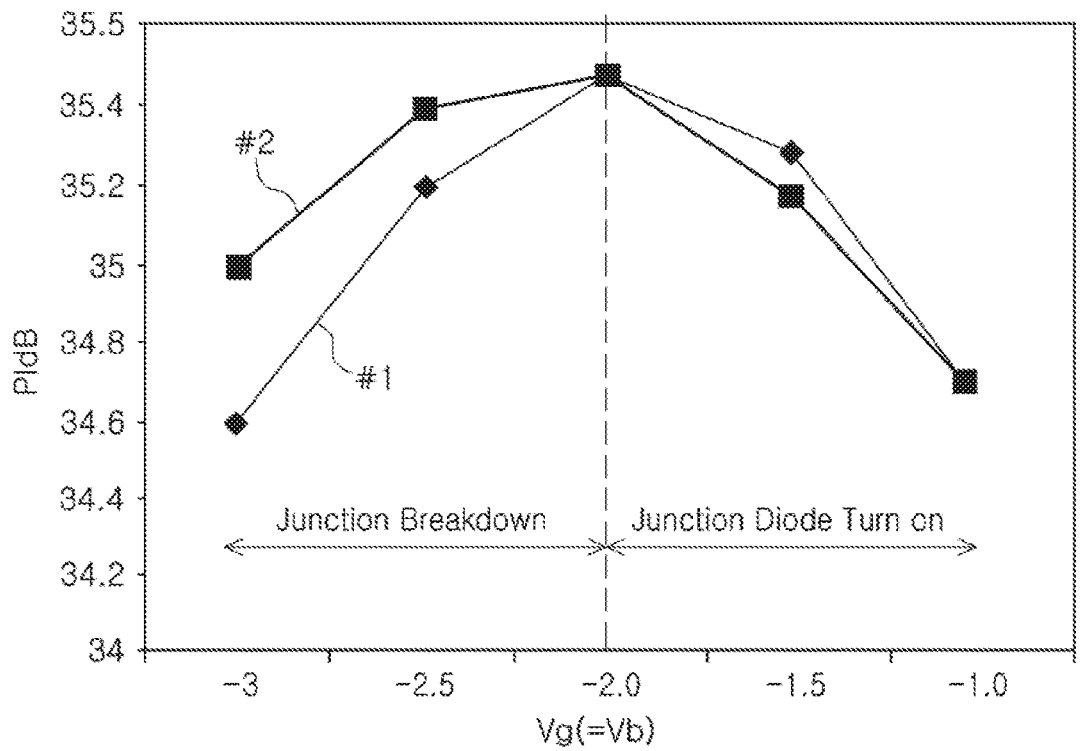
FIG. 12 is a graph illustrating a measurement result for an RF switch according to an example.

FIG. 12 is a graph illustrating a measurement result for an RF switch according to an example.

The graph of FIG. 12 illustrates a relationship between an off-voltage and power handling capability (P1dB) with respect to two samples (spl) #1 and #2. The relationship is a result obtained by using VDD as a switching voltage of an on-path and measuring the P1dB while varying off-voltages Vg and Vb from −3 V to −1 V.

In the graph of FIG. 12, an X-axis denotes an off-voltage (a case in which a gate-off voltage and a body-off voltage are the same) and a Y-axis denotes power handling capability (P1dB).

Referring to FIG. 12, it can be seen that the P1dB of the two samples #1 and #2 is highest when Vb=−2 V.

Figure 13:
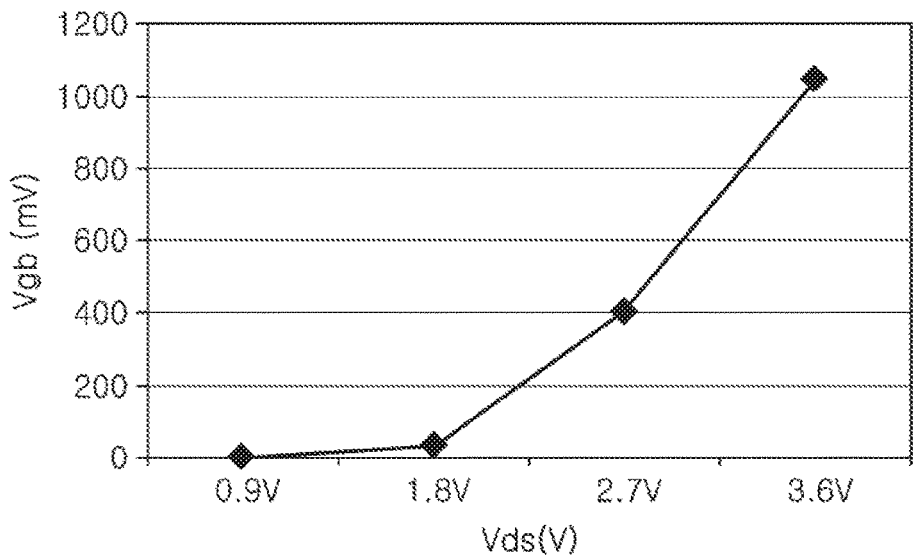
FIG. 13 is a graph illustrating a body voltage and body current relationship graph depending on a body voltage increase effect of an RF switch according to an example.

FIG. 13 is a graph illustrating a body voltage and body current relationship graph depending on a body voltage increase effect of an RF switch according to an example.

Referring to FIGS. 6 and 13, when Vds is lower than a specific voltage (for example, 1.8 V), a gate leakage current Ig and a body leakage current Ib have significantly small values and Vb=Vb1 and Vg=Vg1.

However, if a stacking number is relatively decreased, VDS applied to an FET of the RF switch is increased and Ib is increased even when VDS<BVDSS. Thus, Vb<Vb1. For example, a body voltage rises even when a negative voltage is applied to Vb, which is referred to as a 'body voltage rise phenomenon' in the present disclosure.

The body leakage current Ib is determined as Ib=(Vb1−Vb)/Rb, and the gate leakage current Ig is determined as Ig=(Vg1−Vg)/Rg. Since Ids=Ib+Ig, Ib may be decreased by increasing Ig. For example, in Ids=Ib+Ig, Ig is increased and Ib is decreased by increasing Vg. Accordingly, when an optimum stacking number of the present disclosure is determined, Vg should be increased to satisfy a condition in which Vb=Vb1.

In this case, a level of Vg, satisfying Vb=Vb1, may be dependent on a process, but a minimal condition is given by Equation 12 (the condition 2).

$$Vg > Vb \qquad \text{Equation 12:}$$

A processor according to an example may be implemented using a central processing unit (CPU), a graphics processing unit (GPU), a microprocessor, an application specific integrated circuit (ASIC), field programmable gate arrays (FPGA), a memory (for example, a RAM, or the like), a nonvolatile memory (for example, a ROM, a flash memory, or the like), an input device (for example, a keyboard, a mouse, a pen, a voice input device, a touch input device, an infrared cameras, a video input device, or the like), an output device (for example, a display, a speaker, a printer, or the like), and a computing environment in which communication connection devices (for example, a modem, a network interface card (NIC), an integrated network interface, a radio frequency transmitter/receiver, an infrared port, a USB connection device or the like) are interconnected (for example, a peripheral component interconnect (PCI), a universal serial bus (USB), firewire (IEEE 1394), an optical bus structure, and the like).

The computing environment may be implemented using a personal computer, a server computer, a handheld or laptop device, a mobile device (a mobile phone, a PDA, a media player, or the like), a multiprocessor system, a consumer electronic device, a minicomputer, a mainframe computer, any of the above systems, or a device distributed computing environment, but are not limited thereto.

According to an example, when a body-off voltage is decreased, a stacking number is decreased by a body-drain breakdown voltage BVbd which is a dominant factor. Meanwhile, when a body-off voltage is increased, a gate-source junction diode is turned on at a point at which the body-off voltage is increased to be higher than a turn-on voltage, to cause leakage. Accordingly, an appropriate body-off voltage may be selected in consideration of such a relationship. As a result, an optimum stacking number may be determined to prevent a design with too many stacking numbers and to prevent insertion loss.

The examples described herein provide an apparatus and a method for determining an optimum stacking number of an RF switch, which may select an appropriate gate-off voltage and an appropriate a body-off voltage and may optimize (significantly reduce) a switch stacking number.

The processor 220 in FIGS. 2 and 3 that performs the operations described in this application may be implemented by hardware components configured to perform the operations described in this application that are performed by the hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The method illustrated in FIG. 4 that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions in the specification, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An apparatus for determining an optimum stacking number of a radio frequency (RF) switch, in which a gate-off voltage and a body-off voltage are used to control transistors stacked in series to enter an OFF state, the apparatus comprising:
    a memory configured to store a peak voltage of a high-frequency signal in a corresponding band, and to store a gate limiting voltage, a drain-source limiting voltage, and a body limiting voltage in a corresponding process for each of the transistors; and
    a processor configured to calculate a gate terminal voltage, a drain-source voltage, and a body terminal voltage using the peak voltage, the gate limiting voltage, the drain-source limiting voltage, and the body limiting voltage stored in the memory and to determine an optimum stacking number based on the gate terminal voltage, the gate limiting voltage, the drain-source voltage, the drain-source limiting voltage, the body terminal voltage, and the body limiting voltage.

2. The apparatus of claim 1, wherein the processor comprises:
    an input unit configured to receive the peak voltage of the high-frequency signal, the gate limiting voltage, the drain-source limiting voltage, and the body limiting voltage from the memory;
    a voltage calculation unit configured to calculate the gate terminal voltage, the drain-source voltage, and the body terminal voltage using the peak voltage, the gate limiting voltage, the drain-source limiting voltage, and the body limiting voltage;
    a stacking number calculation unit configured to calculate a stacking number, satisfying a gate stacking number condition in which the gate terminal voltage is lower than the gate limiting voltage, to calculate a stacking number, satisfying a both end stacking number condition in which the drain-source voltage is lower than the drain-source limiting voltage, and to calculate a stacking number satisfying a body stacking number condition in which the body terminal voltage is lower than the body limiting voltage; and
    an optimum stacking number determination unit configured to determine the optimum stacking number based on a minimum stacking number among stacking numbers commonly satisfying the gate stacking number condition, the both end stacking number condition, and the body stacking number condition.

3. The apparatus of claim 2, wherein the optimum stacking number determination unit is configured to determine the gate-off voltage and the body-off voltage corresponding to the optimum stacking number.

4. The apparatus of claim 3, wherein the optimum stacking number determination unit is configured to determine the gate-off voltage and the body-off voltage satisfying a first condition, included in a predetermined negative voltage range, and a second condition, in which the body-off voltage is lower than the gate-off voltage, during determination of the gate-off voltage and the body-off voltage.

5. The apparatus of claim 4, wherein the gate terminal voltage includes a gate-drain voltage Vgd and a gate-source voltage Vgs,
    the body terminal voltage comprises a body-drain voltage Vbd and a body-source voltage Vbs,
    the gate limiting voltage comprises a gate-drain breakdown voltage BVGD and a gate-source threshold voltage Vth,
    the drain-source limiting voltage is a drain-source breakdown voltage BVDSS, and
    the body limiting voltage comprises a body-drain breakdown voltage BVbd and a body-source diode turn-on voltage Vdi.

6. The apparatus of claim 5, wherein the stacking number calculation unit is configured to calculate a first stacking number N1, satisfying Equation 1, and a second stacking number N2, satisfying Equation 2, during calculation of the stacking number satisfying the gate stacking number condition, where $$BVGD > Vgd, BVGD > Vpk/2*(N1) - Vg, \quad \text{Equation 1:}$$

$$Vgs < Vth, Vpk/2*(N2) + Vg < Vth, \text{ and} \quad \text{Equation 2:}$$

Vpk is a peak voltage and Vg is the gate-off voltage.

7. The apparatus of claim 6, wherein the stacking number calculation unit is configured to calculate a third stacking number N3, satisfying Equation 3, during calculation of the stacking number satisfying the both end stacking number condition, where $$Vds < BVDSS, (N3) > Vpk/(a*Vg+b), \text{ and} \quad \text{Equation 3:}$$

a is a negative constant and b is a positive constant.

8. The apparatus of claim 7, wherein the stacking number calculation unit is configured to calculate a fourth stacking number N4, satisfying Equation 4, and a fifth stacking number N5, satisfying Equation 5, during calculation of the stacking number satisfying the body stacking number condition, where $$BVbd > Vbd, BVbd > Vpk/2*(N4) - Vb, \quad \text{Equation 4:}$$

$$Vbs < Vdi, Vpk/2*(N5) + Vb < Vdi, \text{ and} \quad \text{Equation 5:}$$

Vb is the body-off voltage.

9. The apparatus of claim 8, wherein the drain-source breakdown voltage BVDSS satisfies Equation 6, where $$BVDSS = (a*Vg+b). \quad \text{Equation 6:}$$

10. A method for determining an optimum stacking number of a radio frequency (RF) switch, in which a gate-off voltage and a body-off voltage are used to control transistors stacked in series to enter an OFF state, the method comprising:
receiving a peak voltage of a high-frequency signal in a corresponding band, and a gate limiting voltage, a drain-source limiting voltage, and a body limiting voltage in a corresponding process for each of the transistors;
calculating a gate terminal voltage, a drain-source voltage, and a body terminal voltage of each of the transistors;
calculating a stacking number satisfying a gate stacking number condition in which the gate terminal voltage is lower than the gate limiting voltage;
calculating a stacking number satisfying a both end stacking number condition in which the drain-source voltage is lower than the drain-source limiting voltage;
calculating a stacking number satisfying a body stacking number condition in which the body terminal voltage is lower than the body limiting voltage; and
determining the optimum stacking number based on a minimum stacking number among stacking numbers commonly satisfying the gate stacking number condition, the both end stacking number condition, and the body stacking number condition.

11. The method of claim 10, further comprising determining the gate-off voltage and the body-off voltage corresponding to the optimum stacking number.

12. The method of claim 11, further comprising determining the gate-off voltage and the body-off voltage satisfying a first condition, included in a predetermined negative voltage range, and a second condition, in which the body-off voltage is lower than the gate-off voltage, during determination of the gate-off voltage and the body-off voltage.

13. The method of claim 12, wherein the gate terminal voltage includes a gate-drain voltage Vgd and a gate-source voltage Vgs,
the body terminal voltage includes a body-drain voltage Vbd and a body-source voltage Vbs,
the gate limiting voltage includes a gate-drain breakdown voltage BVGD and a gate-source threshold voltage Vth,
the drain-source limiting voltage is a drain-source breakdown voltage BVDSS, and
the body limiting voltage includes a body-drain breakdown voltage BVbd and a body-source diode turn-on voltage Vdi.

14. The method of claim 13, further comprising calculating a first stacking number N1, satisfying Equation 1, and a second stacking number N2, satisfying Equation 2, during calculation of the stacking number satisfying the gate stacking number condition, where $$BVGD > Vgd, BVGD > Vpk/2*(N1) - Vg, \quad \text{Equation 1:}$$

$$Vgs < Vth, Vpk/2*(N2) + Vg < Vth, \text{ and} \quad \text{Equation 2:}$$

Vpk is a peak voltage and Vg is the gate-off voltage.

15. The method of claim 14, further comprising calculating a third stacking number N3, satisfying Equation 3, during calculation of the stacking number satisfying the both end stacking number condition, where $$Vds < BVDSS, (N3) > Vpk/(a*Vg+b), \text{ and} \quad \text{Equation 3:}$$

a is a negative constant and b is a positive constant.

16. The method of claim 15, wherein the calculating a stacking number satisfying the body stacking number condition calculates a fourth stacking number N4, satisfying Equation 4, and a fifth stacking number N5, satisfying Equation 5, during calculation of the stacking number satisfying the body stacking number condition, where $$BVbd > Vbd, BVbd > Vpk/2*(N4) - Vb, \quad \text{Equation 4:}$$

$$Vbs < Vdi, Vpk/2*(N5) + Vb < Vdi, \text{ and} \quad \text{Equation 5:}$$

Vb is the body-off voltage.

17. The method of claim 16, wherein the drain-source breakdown voltage BVDSS satisfies Equation 6, where $$BVDSS = (a*Vg+b). \quad \text{Equation 6:}$$

18. An apparatus comprising:
a memory configured to store a peak voltage of a high-frequency signal and limiting voltages associated with transistors;
a processor configured to calculate terminal voltages based on the limiting voltages stored in the memory and to determine an optimum stacking number of the transistors based on the limiting voltages and the terminal voltages; and
a voltage generator configured to generate a gate-off voltage and a body-off voltage corresponding to the optimum stacking number determined by the processor.

19. The apparatus of claim 18, wherein the transistors are stacked in series in a radio frequency switch and the gate-off voltage and the body-off voltage are used to control the transistors to enter an OFF state.

* * * * *